US009536722B2

(12) United States Patent
Grinfeld et al.

(10) Patent No.: US 9,536,722 B2
(45) Date of Patent: Jan. 3, 2017

(54) ION GUIDE

(71) Applicant: Thermo Fisher Scientific (Bremen) GmbH, Bremen (DE)

(72) Inventors: Dmitry Grinfeld, Bremen (DE); Jan-Peter Hauschild, Bremen (DE); Wilko Balschun, Bremen (DE); Eduard Denisov, Bremen (DE); Alexander Makarov, Bremen (DE)

(73) Assignee: Thermo Fisher Scientific (Bremen) GmbH, San Jose, CA (US)

( * ) Notice: Subject to any disclaimer, the term of this patent is extended or adjusted under 35 U.S.C. 154(b) by 0 days.

(21) Appl. No.: 14/428,144

(22) PCT Filed: Sep. 19, 2013

(86) PCT No.: PCT/EP2013/069509
§ 371 (c)(1),
(2) Date: Mar. 13, 2015

(87) PCT Pub. No.: WO2014/048837
PCT Pub. Date: Apr. 3, 2014

(65) Prior Publication Data
US 2015/0228467 A1    Aug. 13, 2015

(30) Foreign Application Priority Data
Sep. 26, 2012  (GB) .................. 1217182.3

(51) Int. Cl.
*H01J 49/06*   (2006.01)
*H01J 49/00*   (2006.01)
*H05K 1/02*    (2006.01)

(52) U.S. Cl.
CPC .......... *H01J 49/063* (2013.01); *H01J 49/0018* (2013.01); *H01J 49/062* (2013.01); *H01J 49/068* (2013.01); *H05K 1/02* (2013.01)

(58) Field of Classification Search
CPC ........ H01J 49/06; H01J 49/061; H01J 49/062; H01J 49/065; H01J 49/066; H01J 49/067; H01J 49/26; H01J 49/40; H01J 49/42; H01J 49/4215; H01J 49/4255; H01J 49/0018; H01J 49/068
See application file for complete search history.

(56) References Cited

U.S. PATENT DOCUMENTS

| 7,928,375 | B1 * | 4/2011 | Mangan | H01J 49/0018 250/283 |
| 2006/0169882 | A1 * | 8/2006 | Pau | G21K 1/003 250/281 |

(Continued)

FOREIGN PATENT DOCUMENTS

| CN | 102254780 A | 11/2011 |
| WO | WO2005119737 A1 | 12/2005 |

OTHER PUBLICATIONS

Lorenz, Ulrich and Rizzo, Thomas. "Planar Multipole Ion Trap/Time of Flight Mass Spectrometer", Anal. Chem. 2011, 83, 7895-7901.*

Primary Examiner — David E Smith
(74) Attorney, Agent, or Firm — David A. Schell

(57) ABSTRACT

An ion guide for mass spectrometry comprising an electrode arrangement of at least two electrodes, at least one of which is an RF electrode, arranged adjacent to each other but spaced apart on a planar surface of a dielectric material and arranged at a distance from an ion flow path, wherein a portion of the dielectric surface is exposed between an adjacent pair of the spaced apart electrodes and wherein at least one electrode of said adjacent pair of electrodes is arranged to overhang the exposed portion of surface between them such that there is no direct line of sight from the ion flow path to the exposed portion of dielectric surface. The device enables RF guiding of ions accompanied by (Continued)

much reduced charging-up of dielectric surfaces and reduced amount of collisions of neutral species with electrodes.

17 Claims, 3 Drawing Sheets

(56) References Cited

U.S. PATENT DOCUMENTS

| | | | |
|---|---|---|---|
| 2008/0067342 A1* | 3/2008 | Ding | H01J 49/004 250/282 |
| 2008/0210859 A1 | 9/2008 | Tolley et al. | |
| 2014/0084156 A1* | 3/2014 | Ristroph | H01J 49/062 250/290 |

* cited by examiner

ION GUIDE

FIELD OF THE INVENTION

This invention generally relates to ion guides for use in mass spectrometry.

BACKGROUND OF THE INVENTION

RF ion guides, such as RF multipoles, are widely used in mass spectrometry in ion optical devices. Examples of devices comprising RF ion guides include mass filters, collision cells, ion traps and transport multipoles. However, the design of such devices presents numerous challenges.

In recent years, RF ion guides with additional axial fields have been developed for better control of ion motion, for example as disclosed in U.S. Pat. No. 5,847,386, U.S. Pat. No. 6,111,250, EP1271611, U.S. Pat. No. 6,674,071, U.S. Pat. No. 6,107,628, U.S. Pat. No. 7,164,125, U.S. Pat. No. 7,064,322 and U.S. Pat. No. 7,564,025. These ion guides typically consist of massive metal or resistive RF rods, usually of circular section, and different means to provide an additional DC distribution along the axis of the guide. Such constructions are typically formed using conventional machining methods and invariably require cumbersome assembly and numerous parts.

In order to simplify the manufacturing of RF ion guides, planar designs have been developed like those described in U.S. Pat. No. 5,572,035, U.S. Pat. No. 6,040,575, U.S. Pat. No. 7,365,317, U.S. Pat. No. 7,786,435, WO2010/014077, U.S. Pat. No. 6,872,941, US2011/240850, WO2006/059123 and WO2004/021385. The latter prior art design is suitable for manufacturing by standard mass-production techniques of electronics, e.g. in the form of printed circuit boards (PCBs), or by lithography for miniaturized designs. Such concepts have been adopted for the production of miniature ion traps for quantum computing (see e.g. Chiaverini et al, Quantum Inform. And Computation, v. 5, No. 6 (2005) 419-439, as well as Kielpinski et al, Nature Vol. 417, 2002, p. 709). However, this approach has the disadvantage of not providing an effective way to construct an ion guide with a deep enough potential well for use in mass spectrometry. Other disadvantages of the foregoing designs include not providing a robust construction that could also be used to confine gas for collisional cooling of ions for example, and charging up of dielectric gaps between electrodes that can affect ion motion. Whilst there are designs without dielectric (e.g. using resistive rods to generate a gradient field), such designs are difficult to manufacture. For conventional multipoles positioned near to the ion source, a large amount of neutral species also typically collide with the multipole rods, which again can affect performance over time.

The invention has been made against this background in order to alleviate one or more of the aforementioned problems.

SUMMARY OF THE INVENTION

According to the invention there is provided an ion guide for mass spectrometry. The ion guide is preferably an RF ion guide. The ion guide is preferably a multipole. The ion guide preferably comprises an electrode arrangement of at least two electrodes, at least one of which is an RF electrode. The at least two electrodes are preferably arranged adjacently to each other but spaced apart on a planar surface of a dielectric material. The at least two electrodes are arranged at a distance from an ion flow path. A portion of the dielectric surface is exposed between an adjacent pair of the spaced apart electrodes on the planar surface and preferably at least one electrode of said adjacent pair of electrodes is arranged to overhang the exposed portion of surface between them such that there is no direct line of sight from the ion flow path to the exposed portion of dielectric surface. The ion flow path is path along which ions travel when the electrodes are biased with a voltage. The ion flow path preferably lies parallel to the planar surface. In accordance with the invention, preferably at least some exposed surface of dielectric between electrodes has one or more electrodes overhanging over it and not in electrical contact with it.

Preferably, there is a plurality of adjacent pairs of spaced apart electrodes and there is a plurality of exposed portions of the dielectric surface, each portion between a respective adjacent pair of spaced apart electrodes. Preferably, at least one electrode of each of said plurality of adjacent pairs of electrodes is arranged to overhang the exposed portion of surface between them such that there is no direct line of sight from the ion flow path to the exposed portion. More preferably, each exposed portion of surface of dielectric between each adjacent pair of electrodes has at least one electrode of the adjacent pair of electrodes arranged to overhang the exposed portion.

Accordingly, in one aspect of the invention, there is provided an ion guide for mass spectrometry comprising an electrode arrangement of at least two electrodes, at least one of which is an RF electrode, arranged adjacent to each other but spaced apart on a planar surface of a dielectric material and arranged at a distance from an ion flow path, wherein a portion of the dielectric surface is exposed between an adjacent pair of the spaced apart electrodes and wherein at least one electrode of said adjacent pair of electrodes is arranged to overhang the exposed portion of surface between them such that there is no direct line of sight from the ion flow path to the exposed portion of dielectric surface.

There may be provided two parallel planar surfaces of dielectric material located spaced apart from each other and facing each other, each facing planar dielectric surface having arranged thereon a respective electrode arrangement. The electrode arrangement on one surface thus faces the electrode arrangement on the other surface. Each electrode arrangement may comprise at least one planar RF electrode lying parallel to the planar dielectric surface. It will be understood that the one or more RF electrodes arranged on one planar dielectric surface are thereby located spaced apart and parallel to the one or more RF electrodes arranged on the other planar dielectric surface. An ion flow path is located in the space between the opposite planar surfaces. The ion flow path is provided parallel to the planar surfaces.

Accordingly, in another aspect of the invention, there is provided an ion guide comprising: two parallel planar surfaces of dielectric material located spaced apart with their planar surfaces facing each other and having a space therebetween, each facing planar dielectric surface having arranged thereon a respective electrode arrangement comprising at least one planar RF electrode with its plane lying parallel to the planar dielectric surface, wherein an ion flow path is provided in the space between the parallel planar dielectric surfaces (thus in the space between the respective electrode arrangements), preferably equidistant therebetween.

The invention provides an ion guide that enables RF guiding of ions accompanied by much reduced charging-up of dielectric surfaces. The metal electrodes are arranged with respect to the dielectric surfaces in such a way that ions and/or droplets tend to fall only on the metal surfaces, which are biased in use, and not on dielectric surfaces. The planar design enables embodiments that have a reduced amount of collisions of neutral species with the electrodes. The design also enables embodiments that enable effective separation of neutral species from ions. The ion guide may be manufactured in a simple manner due to the planar electrode construction and the ability to use planar dielectric materials such as printed circuit board. The design may be realised in embodiments permitting filling of the ion guide with gas for collisional cooling or ion fragmentation. These and other advantages are described in more detail below.

Various preferred embodiments will now be summarised.

The dielectric material may be any suitable insulating substrate, for example glass or ceramic. Preferably, the dielectric material is printed circuit board material. In such embodiments, the invention may be manufactured using mass-production techniques of electronics manufacture.

The electrodes are most preferably planar, with their plane parallel to the planar dielectric surface on which they are arranged. The electrodes are planar which means that their thickness (i.e. their dimension perpendicular to the planar dielectric surface) is less than, typically much less than, their width or length (i.e. their dimensions parallel to the planar dielectric surface). The electrodes are preferably also elongate, i.e. in an axial direction. Thereby the elongate electrodes may provide a linear ion guide. The elongate electrodes may be straight or curved, i.e. bent. This means bent in the plane of the planar dielectric surface. The electrodes may be bent in a simple curve or in an S-shape or other shape as examples. This elongate configuration applies to RF electrodes and DC electrodes. In this specification, the term RF electrode refers to an electrode to which an RF voltage supply is connected, whether or not an additional DC voltage supply is also optionally applied to it. The term DC electrode herein refers to an electrode to which a DC voltage supply is connected but not an RF supply.

An adjacent pair of electrodes on a planar dielectric surface are preferably arranged such that their ion-facing surfaces are at different distances, i.e. at different heights, from the surface of the dielectric material. Thus, the electrode of the pair with its ion-facing surface at the greater distance from the surface than the other is the electrode that overhangs the exposed portion of dielectric surface. This may also facilitate the overhanging of one electrode over at least part of an adjacent electrode and thereby even greater shadowing of the exposed portion of dielectric surface therebetween. Thus, the overhanging electrode preferably overhangs at least part of the other electrode of said adjacent pair of electrodes. Preferably, the overhanging electrode is an RF electrode. Thus, in such embodiments, the RF electrode may be the electrode that has an ion-facing surface at a greater distance or height from the dielectric surface to enable it to overhang.

The at least two electrodes of the electrode arrangement on a planar dielectric surface may comprise at least one DC electrode. The at least one DC electrode is preferably also planar with its plane parallel to the planar dielectric surface. Accordingly, the said adjacent pair of electrodes may comprise at least an RF electrode and a DC electrode, especially a planar RF and a planar DC electrode. The RF electrode(s) may be arranged at a distance from the dielectric surface. The DC electrode may be etched onto the dielectric surface. The RF electrode is preferably positioned at a greater distance or height above the dielectric surface than an adjacent DC electrode and more preferably overhangs at least part of the DC electrode.

The ion guide is preferably an ion guide having an axial field.

At least one DC electrode may provide an axial electric field gradient to move ions along the ion optical axis.

At least one DC electrode may provide an axial field in the form of an axial potential well to trap ions axially in the ion optical device.

The at least one DC electrode is preferably segmented in the axial direction for enabling an axial field to be generated by the electrode. At least some of the segments are preferably biased in use with different voltages to provide the axial field.

In addition or alternatively to the DC electrode, the at least one RF electrode may be segmented to provide an axial field gradient or axial potential well.

Preferably, there are provided a plurality of RF electrodes (especially planar RF electrodes) in each electrode arrangement on a planar dielectric surface. More preferably, each electrode arrangement comprises two RF electrodes, making four RF electrodes in total (i.e. a quadrupole). As examples, the ion guide may have a total of two, four, six or eight RF electrodes. The ion guide may be, for example, a quadrupole, hexapole or octapole.

Preferably, there are provided a plurality of DC electrodes in each electrode arrangement on a planar surface.

Preferably, each RF electrode has at least one DC electrode disposed adjacent to but spaced apart from it.

Preferably, there are provided at least two RF electrodes and at least one DC electrode in the electrode arrangement or in each electrode arrangement. In certain preferred embodiments, there are provided at least two RF electrodes and at least two DC electrodes in the electrode arrangement or in each electrode arrangement. In particularly preferred embodiments, there are provided at least two RF electrodes and at least three DC electrodes in the electrode arrangement or in each electrode arrangement. For example, there may be provided two RF electrodes three DC electrodes in the electrode arrangement or in each electrode arrangement, optionally arranged such that the two RF electrodes have a DC electrode located between them and each RF electrode has a DC electrode located outside it (with respect to the ion optical axis).

It will be appreciated that the electrodes in a respective electrode arrangement on a surface are not in electrical contact with each other. Rather, a portion of dielectric surface is left exposed between adjacent electrodes in an electrode arrangement so that they are not in electrical contact.

In preferred embodiments, there is provided a first such electrode arrangement, i.e. as described herein, and there is a second such electrode arrangement spaced apart from the first such electrode arrangement, preferably parallel thereto. Preferably, the electrodes of the first such electrode arrangement face the electrodes of the second such electrode arrangement and the ion flow path is arranged between the first and second such electrode arrangements, preferably equidistant therebetween. The first and second such electrode arrangements in general may each comprise N RF electrodes with alternating RF phases (N=2, 3, 4 or higher), thereby forming a 2N polar multipole field (N=2 quadrupole, N=3 hexapole, N=4 octapole, etc.). Preferably, the first such electrode arrangement and the second such electrode arrangement together form a multipole electrode arrangement. Thus, each electrode arrangement is provided preferably on a separate piece of dielectric material such as a separate piece of circuit board material and each piece of dielectric material thereby carries one half of the electrodes of the whole multipole electrode arrangement. In one type of embodiment, the gap between the first and second such electrode arrangements is preferably at least 1 mm, or at least 3 mm, or at least 5 mm. Most preferably, the gap is 2 to 10 mm. However, the ion guide could be scaled up or down in size by at least an order of magnitude to suit the required application. For example, miniaturisation could enable the ion guide to be fabricated as a micro system device. In general, the gap between the first and second such electrode arrangements is about 2 to 3 times larger than the height of the ion beam that travels along the ion path in use. The exposed portion of dielectric surface between electrodes may be in the form of said one or more grooves, i.e. with the groove being formed in the portion of dielectric surface between the adjacent electrodes. There may be provided one or more grooves between each RF electrode and an electrode adjacent thereto (e.g. DC electrode). This increases the tracking distance between adjacent electrodes and increases the shadowing of the open dielectric surface.

At least one, preferably each, DC electrode may be segmented (i.e. provided in segments) in the direction of the ion optical axis (axial direction), wherein the size of gaps between segments of the DC electrode is minimised as much as possible (preferably <0.15 mm, or <0.10 mm, or <0.05 mm) and/or such gaps are formed as grooves in the dielectric surface. Such small gaps are possible because the voltages between adjacent DC electrode segments are quite small, typically <1-2 V.

The ion guide may form one or more of the following ion optical devices: an ion trap, a mass analyser (i.e. mass filter), a collision cell, a fragmentation cell, an ion mobility spectrometer, an ion transport multipole, and an ion funnel. Accordingly, the invention also provides an ion optical device comprising the ion guide, wherein the ion optical device is selected from an ion trap, a mass analyser, a collision cell, a fragmentation cell, an ion mobility spectrometer, an ion transport multipole, and an ion funnel.

The ion guide may be a straight linear or curved (i.e. bent) linear ion guide. It may be an S-shaped ion guide. In this case, the ion guide may comprise at least one straight linear or curved linear RF electrode. The curved linear ion guide may be, e.g., a bent linear ion trap or a bent transport multipole.

The ion guide may have side walls enclosing the space between the planar dielectric surfaces. This enables gas filling of the space between the planar dielectric surfaces, for example for collisional cooling of ions or for use as a collision cell and ion fragmentation. The side walls may be bent, optionally wherein at last one of the side walls has an aperture therein for neutral species or droplets to pass through.

The above features are further described below with reference to the Figures.

LIST OF FIGURES

DETAILED DESCRIPTION OF EMBODIMENTS OF THE INVENTION

In order to assist further understanding of the invention, but without limiting the scope thereof, various exemplary embodiments of the invention are described below with reference to the Figures.

Figure 1:
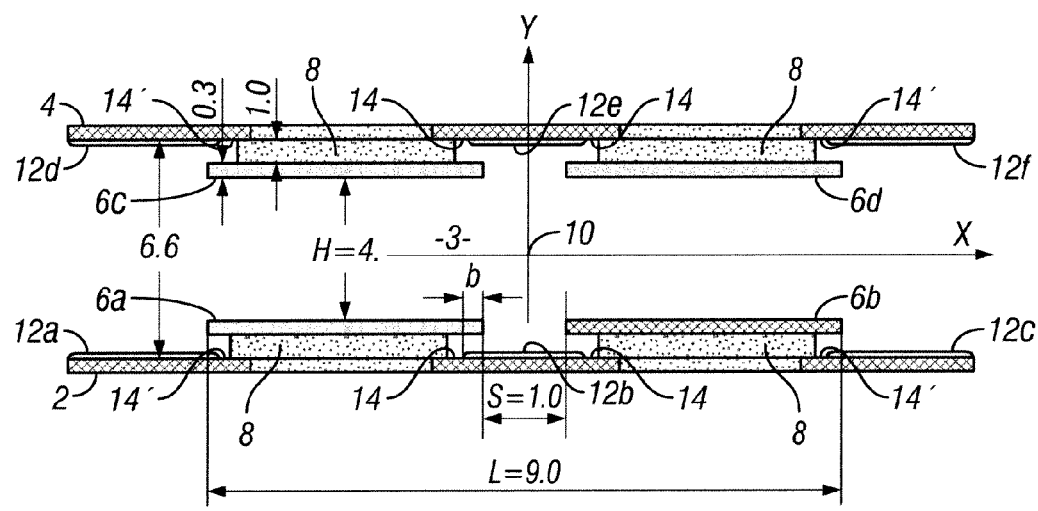
FIG. 1 shows a schematic sectional view of an embodiment according to the invention in the form of a quadrupolar RF ion guide.

Referring to FIG. 1, there is shown a schematic sectional view of an embodiment of an RF ion guide according to the invention, with examples of dimensions in millimeters (mm) indicated. The ion guide comprises a first planar printed circuit board (PCB) (2) and spaced apart therefrom a second planar PCB (4). A space (3) thus exists between the PCBs. The PCBs (2) and (4) are arranged with the planes of the PCBs parallel to each other and facing each other. In the Figure, the planes of the PCBs extend perpendicular to the plane of the drawing, i.e. in the X-Z plane (the Z-axis running out of the plane of the drawing, parallel to the plane of the PCBs). The axis X is shown in the plane of the drawing, parallel to the plane of the PCBs and the axis Y is shown in the plane of the drawing, perpendicular to the plane of the PCBs. The distance between the PCBs is 6.6 mm in this example.

The first PCB (2) has two RF electrodes (6a) and (6b) attached to its surface that faces the second PCB (4). The RF electrodes (6a) and (6b) are planar metal electrodes that are arranged parallel to the surface of the PCB (2). A stainless steel is typically used as the metal such as a type used to form springs. Soldering or resistive gluing may be used to fix the electrodes to the PCB. For soldering, it may be possible for the metal to be covered by an intermediate layer (e.g. gold). They are also thereby parallel to the surface of the PCB (4). The RF electrodes (6a) and (6b) are also elongate and extend in the direction Z perpendicular to the plane of the drawing. The ion guide is thus elongate in the direction of the RF electrodes' length (the Z direction, also termed the axial direction). The thickness of the RF electrodes (i.e. its dimension perpendicular to the surface, i.e. in the Y direction) is 0.3 mm in this example. The RF electrodes (6a) and (6b) are attached at a distance from the surface of the PCB (2), in this case by means of a respective spacer layer (8), which is 1.0 mm thick. The spacer may for example be made from the PCB material. The material may be cut into shape before laminating it to the rest of the PCB. However, by forming the metal RF electrodes into an appropriate shape (see FIG. 2 for example) this step of using a spacer can be omitted. Each electrode (6a) and (6b) is 4.0 mm wide and the distance, S, between the closest edges of the electrodes (6a) and (6b) is 1.0 mm in the example. Thus, the distance, L, from the outer edge of electrode (6a) to the outer edge of electrode (6b) is 9.0 mm.

The second PCB (4) likewise has two RF electrodes (6c) and (6d) attached to its surface that faces the first PCB (4). The RF electrodes (6c) and (6d) are again planar metal electrodes that are arranged parallel to the surface of the PCB (4). They are also thereby parallel to the surface of the PCB (2) and parallel to the RF electrodes (6a) and (6b) on the PCB (2). The RF electrodes (6c) and (6d) are also elongate and extend in the direction Z perpendicular to the plane of the drawing. The dimensions relating to the RF electrodes (6c) and (6d) on the second PCB are the same as those given for the corresponding electrodes (6a) and (6b)

on the first PCB and electrodes (6c) and (6d) again are attached at a distance from the PCB surface by means of respective spacer layer (8).

The perpendicular gap, H, between the electrodes (6a), (6b) of the first PCB and the electrodes (6c), (6d) of the second PCB is 4 mm in the shown example. In other embodiments the gap, H, could be varied, for example from 3 to 5 mm, by varying the distance between the PCBs and/or by varying the thickness of the spacer layer (8). The gap, H, between the electrode arrangements on each PCB is preferably at least 3 mm. However, the gap could be varied by an order of magnitude depending on the application, such as being an order of magnitude smaller in micro systems. This gap is wide enough that there are fewer collisions of neutral species with the electrodes than in conventional designs, especially in the case of a bent multipole as described below.

The RF electrodes (6a), (6b), (6c) and (6d) form a multipole (in this case a quadrupole). It will be appreciated that just two planar surfaces enable the four RF electrode multipole design. In use, an RF voltage is applied to the electrodes. The adjacent RF electrodes of the multipole must have opposite phase so that the voltage connections to the RF electrodes are made in two sets (shown by the different shading). Electrodes (6a) and (6d) are connected as one set (and thus have the same phase as each other) whilst electrodes (6b) and (6c) are connected as another set (and thus have the same phase as each other, but opposite to the phase on electrodes (6a) and (6d)).

The biased RF electrodes (6a), (6b), (6c) and (6d) of the multipole produce a pseudopotential well centred at the mid-point between the four RF electrodes that defines an ion flow path in the form of ion optical axis (10) so that ions, typically as an ion beam, entering the ion guide along the z direction are confined within the ion guide to travel along axis (10). It will be appreciated that the ion optical axis (10) thus runs parallel to the RF electrodes in the axial direction.

The ion guide also comprises a number of planar DC electrodes. The DC electrodes cover portions of the dielectric surface adjacent the RF electrodes, in this example between RF electrodes and outside the RF electrodes. This can help to prevent charge up of dielectric surface. The DC electrodes may also provide an axial field in certain embodiments for faster ion transport. The first PCB (2) has three such DC electrodes (12a), (12b) and (12c) arranged thereon as shown. Outer DC electrodes (12a) and (12c) are arranged on the PCB to the outside of the RF electrodes (6a) and (6b) respectively. Central DC electrode (12b) is arranged on the PCB between the RF electrodes (6a) and (6b). The DC electrodes are elongate and extend parallel to the elongate RF electrodes in the Z direction (axial direction). The second PCB (4) similarly has three DC electrodes (12d), (12e) and (12f) arranged thereon in an analogous manner as shown. The DC electrodes are etched on the PCB but may be formed by other methods, e.g. as stamped parts. The DC electrodes are thus arranged directly on the PCB surface and therefore the RF electrodes (6a), (6b), (6c) and (6d) are positioned at a greater distance from the PCB surface than the DC electrodes for purposes explained below.

The RF electrodes are separated from the adjacent DC electrodes by a portion of dielectric PCB surface that is exposed, i.e. not covered by the DC electrodes. Four such portions (14) of exposed dielectric surface are indicated between the central DC electrodes (12b, 12e) and the RF electrodes. In order to minimise charging up of these exposed portions, the RF electrodes are configured such that they overhang these portions (14) of exposed dielectric surface when viewed from the ion optical axis (10). In other words, the exposed PCB surface (14) lies in the shadow of the overhanging RF electrodes. Ions consequently have no line of sight to the exposed PCB. The RF electrodes are wider than the spacing layer (8) by which they are attached to the PCB and thereby are able to overhang the adjacent exposed PCB surface. For more effective shadowing of the PCB, the edges of the RF electrodes also overhang the edge part of their adjacent DC electrodes when viewed in a direction perpendicular to the plane of the PCB. In the example of FIG. 1, the length, b, is shown where the RF electrode overhangs the adjacent DC electrode. Further portions (14') of exposed dielectric surface are indicated between the outer DC electrodes (12a, 12c, 12d, 12f) and the RF electrodes. These portions also have overhanging electrodes shadowing them.

In practice, the metal RF electrodes may be made using electrochemical etching (electroetching) or laser cutting or extrusion or stamping or other suitable fabrication methods. Electroetched or stamped parts as RF electrodes are preferred.

Figure 2:
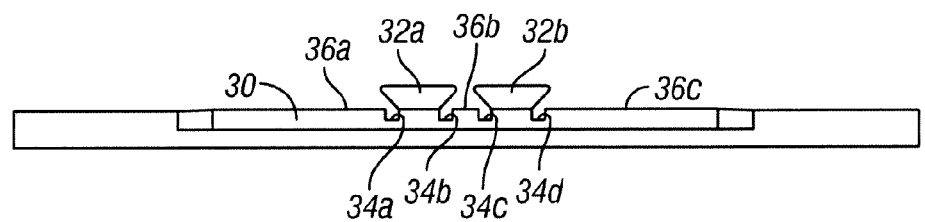
FIG. 2 shows a schematic sectional view of part of another embodiment according to the invention.

Referring to FIG. 2, there is shown in schematic side view one PCB surface (30) of an ion guide according to another embodiment of the invention provided with metal RF electrodes (32a, 32b) made by one of the aforementioned methods on the PCB substrate. Grooves (34a, 34b, 34c, 34d) around the RF electrodes are provided to increase the tracking distance to the adjacent DC electrodes (36a, 36b, 36c). This time the metal RF electrodes are formed so that the spacer layer is not required in order for the RF electrodes to overhang. A similar second PCB (not shown) also supporting a similar electrode arrangement may be provided spaced apart and parallel to the PCB shown in FIG. 2 to provide a quadrupole ion guide.

As mentioned above, the DC electrodes may provide an axial electric field (i.e. in the Z direction) in certain embodiments for faster ion transport. For this purpose, the DC electrodes may be provided as a chain of electrode segments arranged in the axial direction to which could be applied an axial field by means of an axial voltage distribution. The axial field distribution could differ between the central chain of electrodes and outer chains, for example when control of field harmonics is required. In certain embodiments, the DC electrodes may be resistive to provide an axial field. The RF electrodes in some embodiments may provide an axial field, e.g. wherein the RF electrodes are segmented and an axial DC voltage distribution is applied to the RF segments.

In ion guides forming mass filters, the RF electrodes may also have a DC voltage component applied.

It can be seen from the above description and drawings that, in one type of preferred embodiment, the ion guide is a multipole and comprises two parallel and spaced apart planar PCB surfaces facing each other. More preferably, each PCB surface has attached to it two planar metal RF electrodes. Further preferably, each PCB surface has attached to it a central planar DC electrode located between the two planar metal RF electrodes and two outer planar DC electrodes, each outer DC electrode being located outside of a respective one of the RF electrodes. The DC electrodes preferably comprise a chain of electrode segments for providing an axial field.

In other embodiments, there may be provided an ion guide having only one planar PCB with one electrode arrangement thereon. The electrode arrangement may comprise one or more RF electrodes. Preferably, in these embodiments, there are also provided one or more DC electrodes on the PCB.

Figure 3:
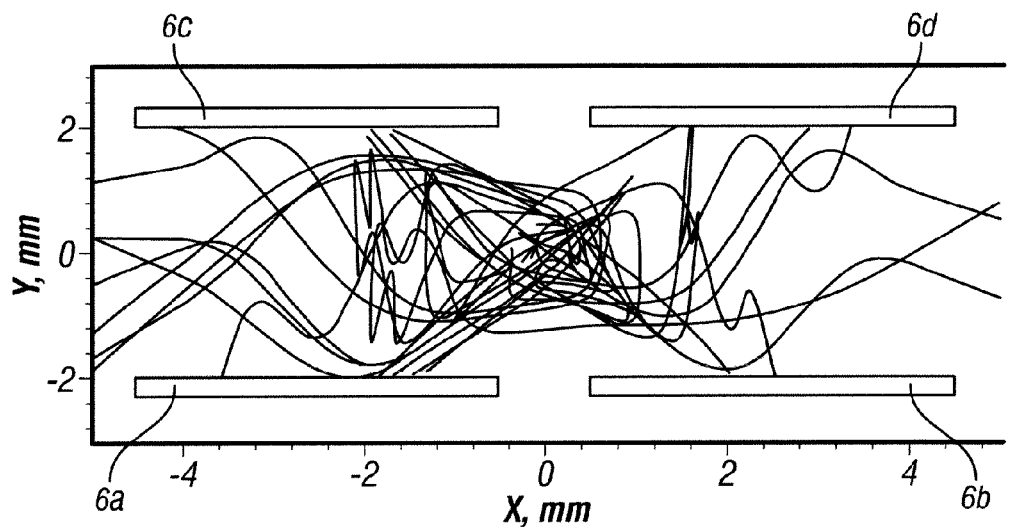
FIG. 3 shows the motion of unstable ions in an embodiment of an ion guide according to the invention.

In FIG. 3 is shown the motion of unstable ions in a multipole ion guide embodiment as shown in FIG. 1. The X and Y axes are shown with dimensions in mm. It can be seen that unstable ions fly only onto the metal RF electrodes (6a to 6d) but not between or under them, thus avoiding any charging of dielectric gaps between electrodes. Some ions may land on dielectric surfaces like those exiting to the lower left side in the Figure. However, in that case, the distance of the dielectrics is further away from the metal RF rods, so any possible charging will negligibly impact the critical region in the centre of the device. The overhanging structure closer to the centre shields the charge build up. Charging of dielectric gaps in the Z-direction (perpendicular to the plane of the drawing), such as gaps between segments of the DC electrodes, may be made negligible by making such dielectric gaps <0.05 mm so that even a fully charged surface will not produce a noticeable voltage perturbation at the axis of the ion guide. Such size gaps may be employed, for example, between electrode segments that are >3 mm long.

Figure 4:
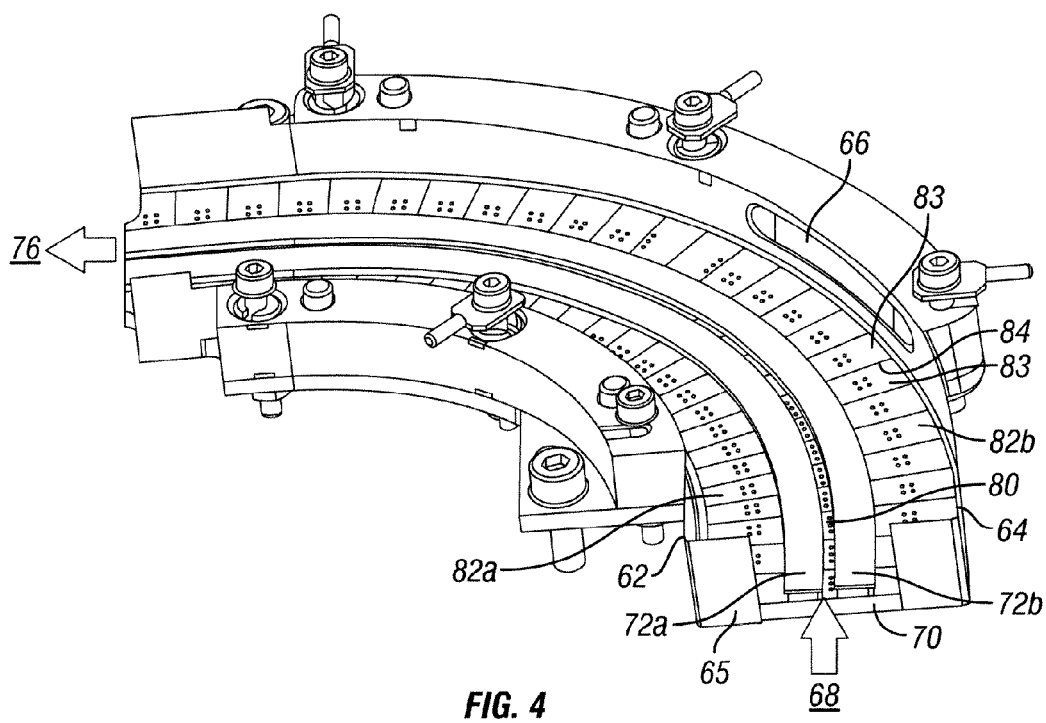
FIG. 4 shows a cut away view of yet another embodiment according to the invention in the form of a bent RF ion guide with the upper PCB and electrodes shown removed for clarity.

The constructions described above can be used to create both straight and non-straight ion guides. An example of a bent ion guide is shown in FIG. 4, which is a perspective view from above with the upper PCB and electrodes removed to allow a better view of the electrode arrangement on the lower PCB. Thus, it will be understood that the ion guide in use will have an upper PCB and electrode arrangement of substantially the same construction as the lower PCB now described arranged parallel and spaced apart from the lower PCB.

The embodiment shown in FIG. 4 comprises bent side walls (62, 64) to confine gas within the ion guide for effective cooling of ions. It may also be filled with gas for operation as a collision cell for ion fragmentation. An end wall (65) partially encloses the entrance end of the ion guide but leaves a central aperture for ions to enter the ion guide. The side and end walls are made of metal but could be made of another material. It will be appreciated that, in other embodiments, the ion guide may not be filled with gas, and the side walls could be omitted. The ions and droplets from an ion source (not shown), such as an electrospray source, enter the ion guide in the axial direction shown by arrow (68) while an aperture or orifice (66) in the outer (greater radius) bent side wall (64) provides an exit for any droplets that may come from the ion source.

In the ion guide of FIG. 4, a lower planar PCB (70) has attached to it planar metal RF electrodes (72a, 72b) that are positioned at a short distance above the surface of the PCB (70) on a spacer layer. The PCB (70) is formed as a bent shape. The RF electrodes (72a, 72b) are planar in the same plane as the PCB surface and extend axially along the length of the ion guide from its entrance end (shown by arrow 68) to its exit end (shown by arrow 76). The RF electrodes (72a, 72b) are bent in the plane of the PCB surface so as to bend the path of ions through 90 degrees. An ion path or optical axis is thereby defined which runs parallel to the RF electrodes (72a, 72b) and lies between them and above the plane of the RF electrodes (72a, 72b). With the upper PCB and electrodes (not shown) in place, the ion optical axis will lie mid-way between the two PCBs. The RF electrodes (72a, 72b) have opposite phase RF voltages applied to them in use and they form one half of a quadrupole ion guide, the other half being provided by the upper PCB and electrode arrangement (not shown) of substantially the same construction and arranged parallel to and spaced apart from the lower PCB (70) analogously to the embodiment shown in FIG. 1.

The PCB (70) also has planar metal DC electrodes (80, 82a, 82b) that extend axially along the length of the ion guide and are etched on the surface of the PCB (therefore the DC electrodes are closer to the PCB surface than the RF electrodes). The DC electrodes (80, 82a, 82b) are also bent in the plane of the PCB surface so as to extend adjacent to the bent RF electrodes (72a, 72b). Central DC electrode (80) lies between the RF electrodes (72a, 72b) with a small gap of PCB dielectric surface open between adjacent electrodes to prevent electrical contact between the RF electrodes and DC electrode. Outer DC electrodes (82a, 82b) lie outside the RF electrodes (72a, 72b) respectively, again with a small gap of PCB dielectric surface left open between adjacent electrodes. The RF electrodes (72a, 72b), being at a height above the PCB surface, are arranged to overhang the small gap of PCB dielectric surface adjacent them and, in this embodiment, also overhang the edges of the adjacent DC electrodes. In this way, ions travelling along the ion optical axis are not able to deposit and charge up the dielectric gaps.

The DC electrodes (82a, 82b), like the RF electrodes, are planar and extend axially along the length of the ion guide from its entrance end (68) to its exit end (76). The DC electrodes, however, are each provided as an axial array of electrode segments (83) with minimised dielectric gaps (84) between adjacent segments. An axial voltage distribution can be applied to the electrode segments of each DC electrode to provide an axial driving field for the ions to move them from entrance to exit or, with axial field reversed, from exit to entrance. The axial field may be a static axial field or a travelling axial field. The dielectric gaps (84) between adjacent segments are made <0.05 mm so that even if the gaps become fully charged it will not produce a noticeable voltage perturbation at the axis of the ion guide.

The planar design of the invention enables an effective separation of neutral species from ions without having most neutrals hitting critical surfaces within the ion guide, since most neutral species just fly straight through. For conventional bent multipoles a large amount of neutrals would hit the bent multipole rods, which will affect the performance over time. The planar structure of the invention thus does not obstruct the path of neutrals to the extent that a conventional multipole ion guide does. The invention thus also provides a method of separating neutral species from ions by providing the ion guide, wherein the ion guide has a bent axis, i.e. wherein the planar electrodes are bent in the plane.

Ion guide constructions according to the invention may be used for various purposes in mass spectrometry. The ion guide may be used as a collision cell for ion fragmentation, ion-molecule reactions, ion-photon reactions and/or ion-ion reactions (preferably with pressure in the ion guide in the range $1\text{-}20\times10^{-3}$ mbar). The ion guide may be provided non-segmented (e.g. comprising single-piece electrodes), segmented (e.g. comprising segmented electrodes), or as a multi-compartment cell.

The ion guide may be used as a straight or bent linear ion trap (preferably with pressures therein of $0.1\text{-}2\times10^{-3}$ mbar). As such, it could be used as an enclosure for ion-molecule or ion-ion reactions as described in U.S. Pat. No. 7,145,139, U.S. Pat. No. 7,759,637. This includes the possibility that RF electrodes are segmented and have similar RF but different DC offset applied to them. Auxiliary RF could be also applied to end apertures of the enclosure. Also, this guide could be used to arrange several adjacent or integrated traps with different pressures as described in U.S. Pat. No. 8,198,580.

The ion guide may be used as a transport multipole, which may be straight or bent.

The ion guide may be used as a multipole mass analyzer, especially a quadrupole mass analyzer, preferably with pressures $<10^{-3}$ mbar.

The ion guide may be used as an ion mobility spectrometer (preferably with pressures 1-5 mbar).

The ion guide may be used as an ion funnel, e.g. with RF electrodes converging and tightening the field (preferably with pressures 1-5 mbar).

The foregoing list of uses is not exhaustive and other uses of the ion guide will be apparent to the person skilled in the art.

The devices employing the ion guide could also be implemented as massively parallel arrays.

Whilst the invention has been exemplified for quadrupolar potential, higher-order multipoles (e.g. hexapoles and octapoles) could also be implemented using the same approach.

The metal electrodes could be attached using robotic assembly, or made as PCBs themselves and bonded to the lower PCB, as known in PCB manufacturing. The metal electrodes can also be soldered to the PCB or adhered using resistive gluing. It may be possible to dispense the solder material in a controlled manner and the metal RF rods will auto-align due to surface tension.

Figure 5:
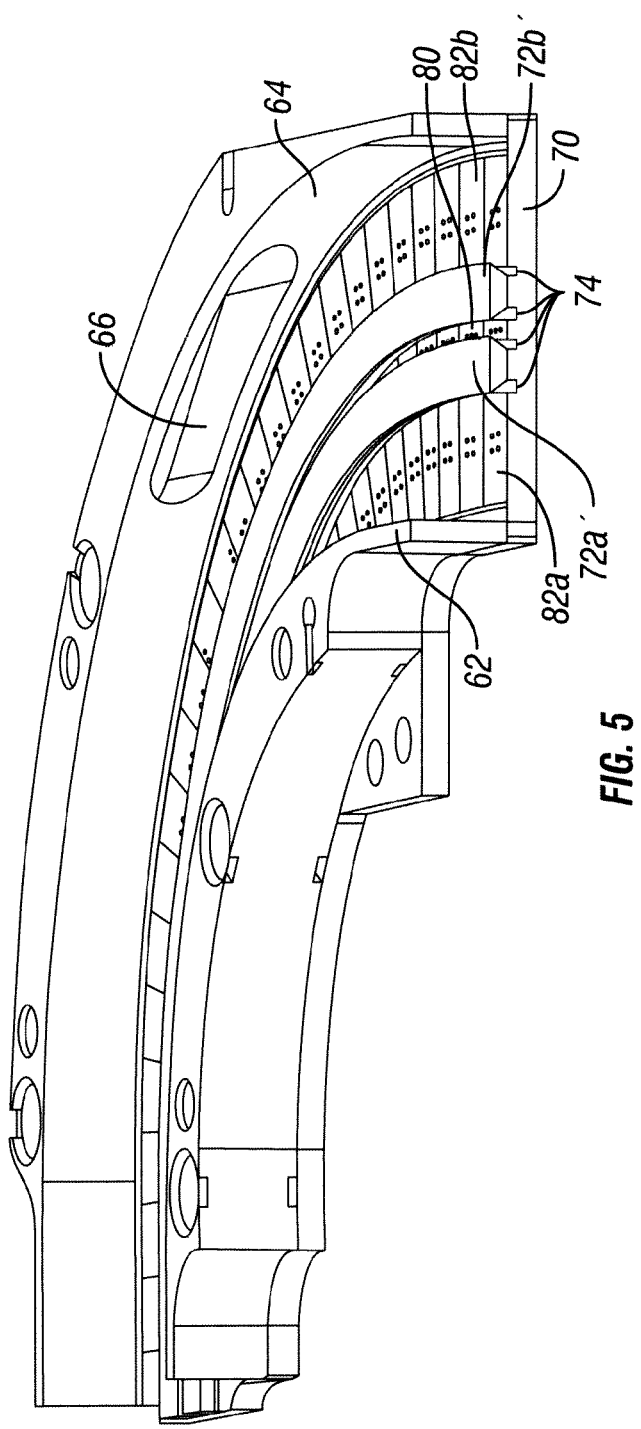
FIG. 5 shows another cut away view of a further embodiment according to the invention in the form of a bent RF ion guide with the upper PCB and electrodes shown removed for clarity.

Referring to FIG. 5, there is shown a further embodiment of bent ion guide, which is similar to the embodiment of FIG. 4 and thus like references denote like parts. As with FIG. 4, in FIG. 5 only the lower PCB and electrode arrangement is shown, the upper PCB and electrode arrangement being shown removed to allow full view of the lower arrangement. In the ion guide of FIG. 5, the main difference to that of FIG. 4 is that the lower planar PCB (70) has attached to it planar metal RF electrodes (72a', 72b') that are formed such that a spacer layer is not required in order for the RF electrodes to overhang adjacent dielectric surfaces. Specifically, the width of the RF electrodes (72a', 72b') tapers towards the PCB surface so that, whilst the ion facing surface of the electrodes is at a short distance above the surface of the PCB (70), the electrodes can also overhang the adjacent exposed dielectric surface, which is in the form of grooves (74) in the PCB that separate the RF electrodes from the adjacent DC electrodes (80, 82a, 82b).

It will be appreciated that the invention provides a cost-effective and yet robust design for RF ion guides of considerable complexity.

As used herein, including in the claims, unless the context indicates otherwise, singular forms of the terms herein are to be construed as including the plural form and vice versa.

Throughout the description and claims of this specification, the words "comprise", "including", "having" and "contain" and variations of the words, for example "comprising" and "comprises" etc, mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

The use of any and all examples, or exemplary language ("for instance", "such as", "for example" and like language) provided herein, is intended merely to better illustrate the invention and does not indicate a limitation on the scope of the invention unless otherwise claimed. No language in the specification should be construed as indicating any non-claimed element as essential to the practice of the invention.

Any steps described in this specification may be performed in any order or simultaneously unless stated or the context requires otherwise.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention claimed is:

1. An ion guide for mass spectrometry comprising an electrode arrangement of at least two electrodes, at least one of which is an RF electrode, arranged adjacent to each other but spaced apart on a planar surface of a dielectric material, wherein the arrangement has been produced by separately providing the dielectric material and arranging the electrodes on it in a subsequent step, and wherein the electrodes are arranged at a distance from an ion flow path, wherein a portion of the dielectric surface is exposed between an adjacent pair of the spaced apart electrodes and wherein at least one electrode of said adjacent pair of electrodes is arranged to overhang the exposed portion of surface between them such that there is no direct line of sight from the ion flow path to the exposed portion of dielectric surface, ion-facing surfaces of said adjacent pair of electrodes are at different distances from the surface of the dielectric material and the electrode of the pair with the surface at a greater distance from the dielectric surface overhangs the exposed portion of dielectric surface and at least a part of the other electrode of the pair.

2. The ion guide according to claim 1, wherein the dielectric material is glass, ceramic or printed circuit board.

3. The ion guide according to claim 1, wherein the ion guide is a multipole.

4. The ion guide according to claim 1, wherein there is a plurality of said pairs of adjacent electrodes having a portion of the dielectric surface exposed between them.

5. The ion guide according to claim 1, wherein the electrode of said adjacent pair of electrodes that overhangs the exposed portion is an RF electrode.

6. The ion guide according to claim 1, wherein the exposed portion of dielectric surface between electrodes is in the form of one or more grooves formed in the portion of dielectric surface between the adjacent electrodes.

7. The ion guide according to claim 1, wherein the electrodes of the electrode arrangement comprise at least one DC electrode.

8. The ion guide according to claim 7, wherein the electrodes comprise at least one DC electrode that provides an axial field.

9. The ion guide according to claim 8, wherein the at least one DC electrode providing an axial field is segmented, wherein the size of gaps between segments of the DC electrode are <0.15 mm and/or such gaps are formed as grooves in the dielectric surface.

10. The ion guide according to claim 1, wherein the electrodes are planar.

11. The ion guide according to claim 1, wherein the electrode arrangement is a first such electrode arrangement and there is a second such electrode arrangement spaced apart from the first such electrode arrangement and parallel thereto and the first and second such electrode arrangements form a multipole wherein the ion optical axis is defined between the first and second such electrode arrangements.

12. The ion guide according to claim 11, wherein the gap between the first and second such electrode arrangements is at least 1 mm.

13. The ion guide according to claim 11, wherein the first and second such electrode arrangements each comprise N RF electrodes with alternating RF phases (N=2, 3, 4 . . . ), thereby forming a 2N polar multipole.

14. The ion guide according to claim 1, wherein the ion guide forms one or more of the following: an ion trap, a mass analyser, a collision cell, a fragmentation cell, an ion mobility spectrometer, an ion transport multipole and an ion funnel.

15. The ion guide according to claim 1, wherein the ion guide is a straight or bent ion guide.

16. The ion guide according to claim 11, wherein the gap between the first and second such electrode arrangements is at least 3 mm.

17. The ion guide according to claim 11, wherein the gap between the first and second such electrode arrangements is at least 5 mm.

* * * * *